United States Patent
Moglianetti et al.

(10) Patent No.: US 10,596,632 B2
(45) Date of Patent: Mar. 24, 2020

(54) METHOD FOR THE SYNTHESIS OF METAL NANOPARTICLES IN AQUEOUS ENVIRONMENT WITHOUT THE USE OF SHAPE DIRECTING AGENTS

(71) Applicant: FONDAZIONE ISTITUTO ITALIANO DI TECNOLOGIA, Genoa (IT)

(72) Inventors: Mauro Moglianetti, Civitanova Marche (IT); Pier Paolo Pompa, Lecce (IT)

(73) Assignee: FONDAZIONE ISTITUTO ITALIANO DI TECNOLOGIA, Genoa (IT)

( * ) Notice: Subject to any disclaimer, the term of this patent is extended or adjusted under 35 U.S.C. 154(b) by 0 days.

(21) Appl. No.: 16/062,143

(22) PCT Filed: Dec. 14, 2016

(86) PCT No.: PCT/IB2016/057607
§ 371 (c)(1),
(2) Date: Jun. 14, 2018

(87) PCT Pub. No.: WO2017/103807
PCT Pub. Date: Jun. 22, 2017

(65) Prior Publication Data
US 2018/0361482 A1 Dec. 20, 2018

(30) Foreign Application Priority Data
Dec. 15, 2015 (IT) .................... 102015000083301

(51) Int. Cl.
*B22F 9/24* (2006.01)
*C30B 7/14* (2006.01)
(Continued)

(52) U.S. Cl.
CPC .............. *B22F 9/24* (2013.01); *B22F 1/0018* (2013.01); *C30B 7/14* (2013.01); *C30B 29/02* (2013.01);
(Continued)

(58) Field of Classification Search
None
See application file for complete search history.

(56) References Cited

U.S. PATENT DOCUMENTS

| 2007/0068343 | A1 | 3/2007 | Lukehart et al. |
| 2010/0280296 | A1* | 11/2010 | Bisson .................... B01J 23/40 |
| | | | 585/277 |

(Continued)

OTHER PUBLICATIONS

Duca M., et al., "Selective electrocatalysis on platinum nanoparticles with preferential (100) orientation prepared by cathodic corrosion", Topics in Catalysis—The Future of Catalysis: A symposium Honoring Professor Jens K. Norskov. vol. 57, No. 1-4, Feb. 2014 pp. 255-264.

(Continued)

*Primary Examiner* — George Wyszomierski
(74) *Attorney, Agent, or Firm* — Silvia Salvadori, P.C.; Silvia Salvadori

(57) ABSTRACT

The present disclosure relates to a seed-growth based method for the synthesis of metal nanoparticles of controlled shape (cubes, cuboids, octahedrons) and size in an aqueous environment, without the use of shape directing agents. The method involves a first step of preparing a solution comprising water, metal seed growth nanoparticles, a metal salt comprising the same metal as the metal seed growth nanoparticles, and a reducing agent; and a second step of heating the solution to between 9 and 130° C. at a rate of between 1° C./min and 5° C./min and at a pressure of between 1 and 5 atm. The method may also be carried out in a reduced oxygen atmosphere and the concentration of oxygen dis- (Continued)

closed in the solution may be less than the concentration of oxygen in an oxygen saturated solution.

17 Claims, 4 Drawing Sheets

(51) Int. Cl.
    *C30B 29/02*     (2006.01)
    *C30B 29/60*     (2006.01)
    *B22F 1/00*     (2006.01)
    *C30B 29/66*     (2006.01)
    *B82Y 40/00*     (2011.01)

(52) U.S. Cl.
CPC .............. *C30B 29/60* (2013.01); *C30B 29/66* (2013.01); *B22F 2001/0037* (2013.01); *B22F 2301/25* (2013.01); *B22F 2304/054* (2013.01); *B22F 2998/00* (2013.01); *B82Y 40/00* (2013.01)

(56) References Cited

U.S. PATENT DOCUMENTS

| | | | |
|---|---|---|---|
| 2016/0082515 A1* | 3/2016 | Lewera | B22F 9/24 75/370 |
| 2016/0256930 A1* | 9/2016 | Rioux | B22F 9/24 |
| 2016/0329121 A1* | 11/2016 | Xiao | H01B 1/02 |
| 2016/0349249 A1* | 12/2016 | Doh | G01N 33/54346 |
| 2018/0193910 A1* | 7/2018 | Kircher | A61K 9/5115 |

OTHER PUBLICATIONS

Gumeci C. et al., "Solvothermal synthesis and electrochemical characterization of shape-control Pt nanocrystals", Journal of Physical Chemistry C Jul. 3, 2014, 118, 14433-14440.

Miyazaki A. et al., "Morphology control of platinum nanoparticles and their catalytic properties", Journal of Nanoparticles Research, vol. 5, 2003, pp. 69-80.

Search Report and Written Opinion of PCT/IB2016/057607 dated Mar. 3, 2017.

\* cited by examiner

METHOD FOR THE SYNTHESIS OF METAL NANOPARTICLES IN AQUEOUS ENVIRONMENT WITHOUT THE USE OF SHAPE DIRECTING AGENTS

This application is a U.S. national stage of PCT/IB2016/057607 filed on 14 Dec. 2016 which claims priority to and the benefit of Italian Application No. 102015000083301 filed on 15 Dec. 2015, the content of which are incorporated herein by reference in their entireties.

FIELD OF THE INVENTION

The present disclosure relates to the synthesis of metal nanoparticles having controlled shape and size, in particular, to the synthesis of platinum or palladium nanoparticles having controlled shape and size. The synthesis does not involve the use of shape directing agents such as polymers and surfactants.

BACKGROUND OF THE INVENTION

Nanoparticles of different shapes have attracted a great deal of attention due to their potential application in catalysis, photonics and other fields such as nanomedicine.

Nanoparticle shape is related to the properties of nanoparticles, and may influence their selectivity in catalytic reactions and their interaction with light and living matter. In particular, platinum nanoparticles have been studied for their unique catalytic properties.

Elemental platinum has a face-centered crystal structure and low index facets [100], [111], [110] are common on platinum nanoparticles. Cubic particles are made up entirely of [100] facets, octahedral particles of [111] facets, whilst cuboctahedra are made of both. During wet chemical reduction (WCR) for nanoparticles synthesis, the autocatalytic growth stage is the moment in which the shape of the nanoparticles is determined. Under pure thermodynamic growth conditions, a platinum nanoparticle will grow as a sphere or with an amorphous shape in order to minimize its surface energy. However, when the reaction occurs under kinetic control, due to reduced reduction rate and/or the presence of shape-directing agents, cubic, tetrahedral, octahedral shapes can be created.

The use of preferentially oriented platinum nanoparticles as catalysts for a variety of chemical reactions has proven to be highly advantageous and represents a major breakthrough for catalysis (M. Duca, P. Rodriguez, A. Yanson and M. M. Koper, Top Catal., 2014, 57, 255-264). For example, in the case of nitrite reduction in alkaline media, the Pt [100] facet has shown to be the most active surface, and is able to reoxidize ammonia to give nitrogen [M. T. M. Koper, Nanoscale, 2011, 3, 2054-2073; M. Duca, M. C. Figueiredo, V. Climent, P. Rodriguez, J. M. Feliu and M. T. M. Koper, J Am Chem Soc, 2011, 133, 10928-10939).

It has also known that by using a Pt [100] electrode as a catalyst for nitrite reduction, it is possible to obtain direct conversion of nitrogen dioxide to nitrogen. This voltammetric feature is extremely sensitive to the quality of the [100] domains and it has been observed that the introduction of controlled defects of any symmetry causes a rapid drop in the selective electrocatalytic conversion to nitrogen. The main voltammetric feature (nitrite reduction to ammonia) is also affected by the loss of surface order. Therefore, this reaction requires nanoparticles with specific characteristics: cuboid nanoparticles with large, well-ordered [100] domains.

Shaped platinum nanoparticles have been obtained by wet chemical reduction using additives and capping agents to control shape (shape directing agents). The presence in the autocatalytic growth stage of shape directing agents such as polymers, surfactants, organic ligands, and ionic salts plays a crucial role in the formation of shaped nanoparticles. Generally these species act by either binding to specific facets to promote asymmetric growth or by altering reduction kinetics so that growth proceeds under thermodynamic or kinetic control. For example, U.S. Pat. No. 8,257,465 describes a method for controlling the shape of metal nanoparticles by using bromide as a shape-directing agent. Bromide is adsorbed onto the surfaces of a seed crystal and is then treated with an oxidizing agent, which oxidatively etches one surface of the seed crystal. Then, in the presence of metal precursor compound and a reducing agent, the exposed surface is able to grow to produce a nanostructure having [100] and [110] facets. It is reported that in the absence of bromide, only cuboctahedrons were produced.

Slower reduction conditions are favoured for obtaining shaped nanoparticles, as they allow more time for the shape-directing agents to interact at the surfaces of the metal particles, making them more effective at shape direction. A lower rate of reduction also favours the formation of fewer seeds and leads to a higher precursor-to-seeds ratio that aids shape formation (J. Yin, J. Wang, M. Li, C. Jin and T. Zhang, Chemistry of Materials, 2012, 24, 2645-2654). Gumeci et al. (J. Phys. Chem. C 2014, 118, 14433-14440) describe a method for the preparation of metal nanoparticles using $Pt(acac)_2$ as the precursor in DMF containing water. The heating rate and reaction temperatures were selected to promote rapid nucleation of seed crystals followed by a period of slow growth to achieve shape-controlled nanoparticles. It was found that increasing the water content beyond 20% (by volume) resulted in agglomeration and loss of shape control.

Another parameter that may influence shape growth is the stabilization of a facet through the use of additives. Chemical species such as ligands and polymers have been used to selectively stabilize specific facets by slowing the growth of these facets, thus making them more abundant on the surface of the final nanoparticle. Unfortunately, ligands and polymers also affect the catalytic properties of the material, and surfactants, such as tetradecyl trimethyl ammonium bromide have shown, to be non-beneficial to catalytic activity (A. Miyazaki, I. Balint and Y. Nakano, Journal of Nanoparticle Research, 2003, 5, 69-80). Oleylamine has also shown to be highly detrimental to the catalytic activity of carbon monoxide oxidation, due to the poisoning properties of the amine group (J. N. Kuhn, C.-K. Tsung, W. Huang and G. A. Somorjai, Journal of Catalysis, 2009, 265, 209-215). Furthermore, although it is possible to partially or completely remove the organic coatings on the surface of the nanoparticles by UV-ozone treatment, thermal annealing or acetic acid washing, these treatments are time-consuming, costly, do not guarantee complete removal. Organic coatings can interfere with the catalytic properties of the nanoparticles.

A method of controlling the shape of metal nanoparticles without using shape-directing agents is described in patent application WO2014/162308 A2. Here it was found that fast heating and cooling rate of a reaction solution influenced the formation of nanoparticles with [100] facets. In order to control the temperature of the reaction solution, a flow system was employed whereby the reaction solution could be passed to a reaction zone and heated for a certain time before being allowed to flow to a cooling zone. The method did not include the use of metal seed nanoparticles.

Despite the advances in the synthesis of nanoparticles having controlled shape and size, there still exists the need in the art for simple, eco-friendly methods of obtaining preferentially shaped nanoparticles that are free of contaminants.

SUMMARY OF THE INVENTION

The inventors of the present disclosure have found that it is possible to form preferentially shaped metal nanoparticles without the use of a shape-directing agent, such as polymers, surfactants, ionic salts and organic ligands and/or without an organic solvent.

Specifically the inventors have found that it is possible to obtain nanoparticles having a high percentage of [100] facets and a low percentage of [110] and/or [111] or having a high percentage of [111] facets and a low percentage of [110] and/or [100] facets by controlling reaction parameters without using any shape directing agent.

The present disclosure provides a method for producing metal nanoparticles predominantly having [100] or [111] facets. The method involves the preparation of a solution comprising water, metal seed growth nanoparticles, a metal salt comprising the same metal as the metal seed growth nanoparticles and a reducing agent. The solution is heated to between 95 and 130° C. The final temperature may be reached by heating at a rate of between 1° C./min and 5° C./min. The pressure of the system is maintained between 1 and 5 atm.

The method may also be carried out in a reduced oxygen atmosphere and the concentration of oxygen dissolved in the solution may be less than the concentration of oxygen in an oxygen saturated solution. For example, the concentration of dissolved oxygen in the solution may be in the range of between 5% and 18% v/v.

The metal seed growth nanoparticles and the metal salt employed in the method of the present disclosure preferably comprise platinum or palladium.

The method of producing metal nanoparticles according to the present disclosure does not involve the use of an organic solvent or a shape-directing agent. As the method does not require an organic solvent, but uses water as the reaction medium, the synthesis of the metal nanoparticles is better for the environment.

DESCRIPTION OF THE FIGURES

The following figures illustrate preferred embodiments of the subject matter disclosed herein. The claimed subject matter may be understood by reference to the following description taken in conjunction with the accompanying figures in which:

DETAILED DESCRIPTION

Figure 1:
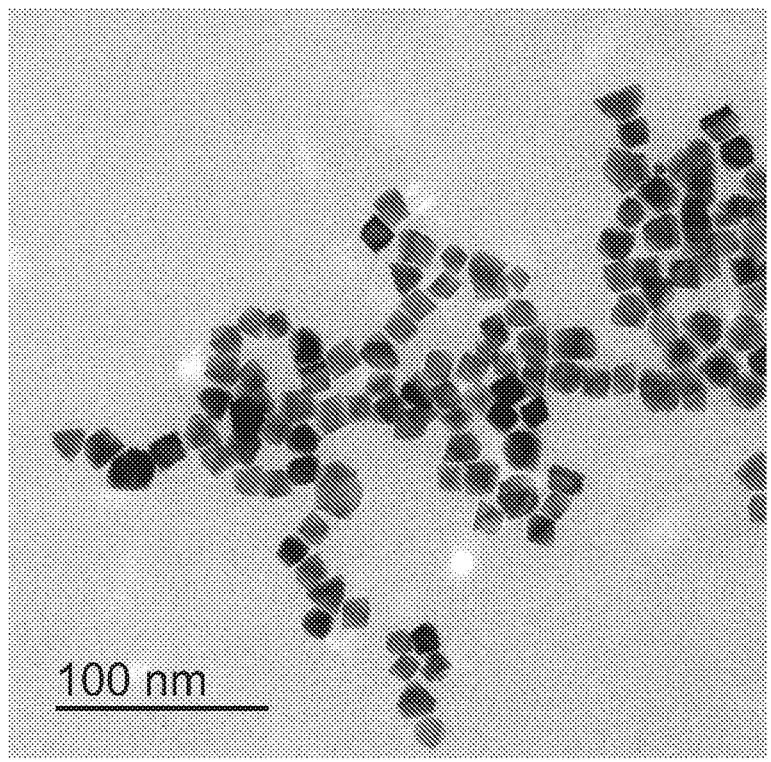
FIG. 1 shows a TEM image of nanoparticles obtained according to an embodiment of the present invention described in example 1.
Figure 2:
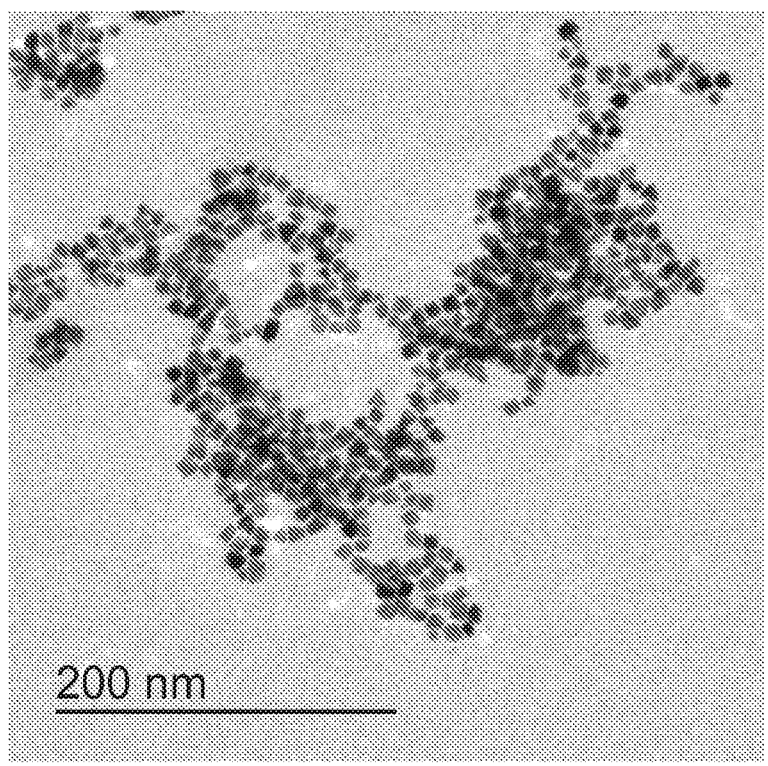
FIG. 2 shows a TEM image of nanoparticles obtained according to a further embodiment described in example 2, wherein the metal precursor concentration is modified.
Figure 3:
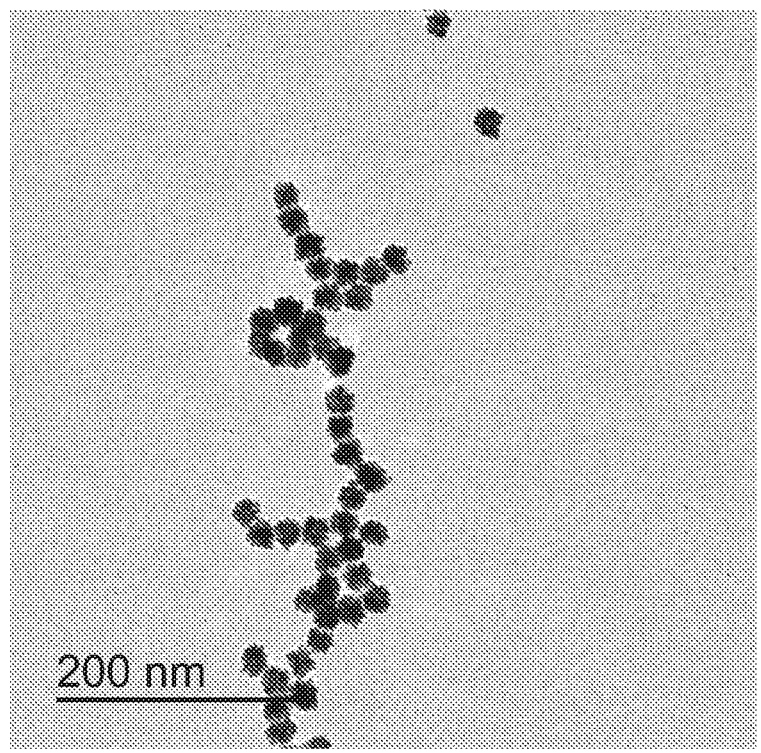
FIG. 3 shows a TEM image of spherical nanoparticles obtained by using the method reported by Bigall at al. and described in example 3.
Figure 4:
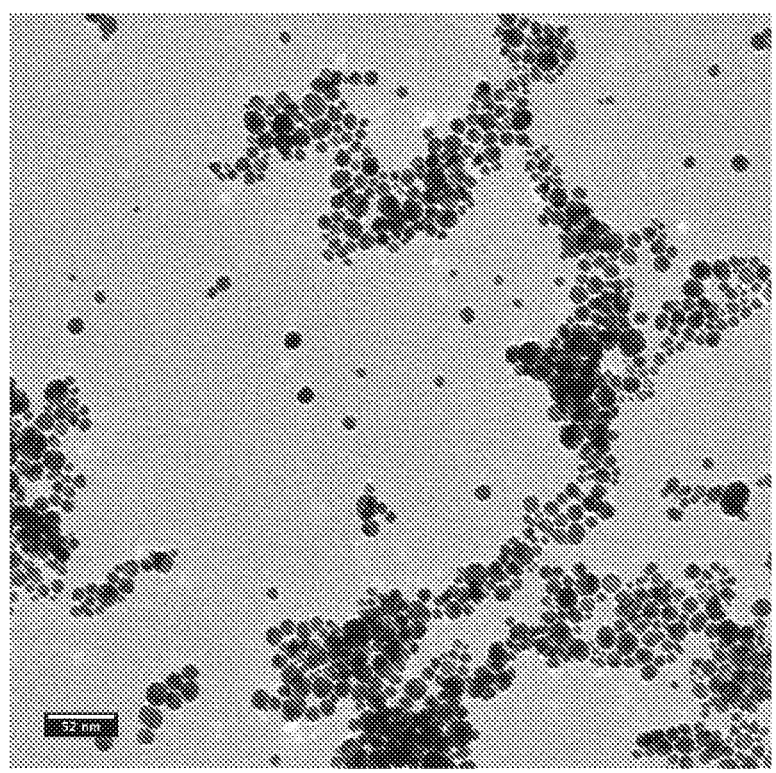
FIG. 4 shows a TEM image of gold nanoparticles obtained by adapting the method of the present invention to gold particles, as described in example 4.
Figure 5:
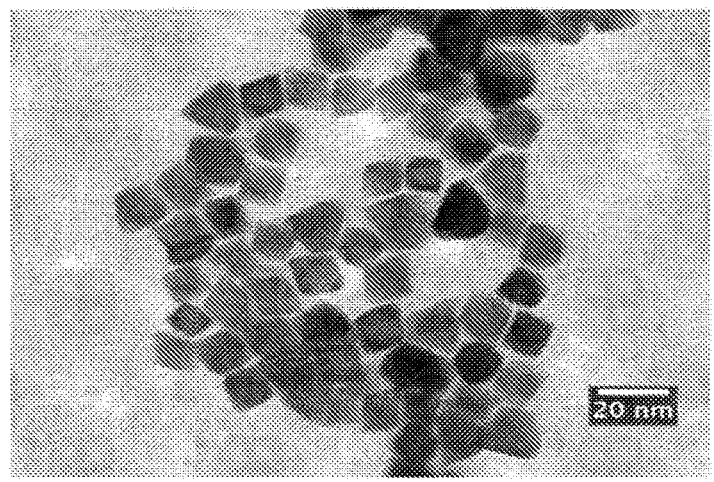
FIG. 5 shows a TEM image of nanoparticles obtained according to an embodiment of the present invention described in example 5.
Figure 6:
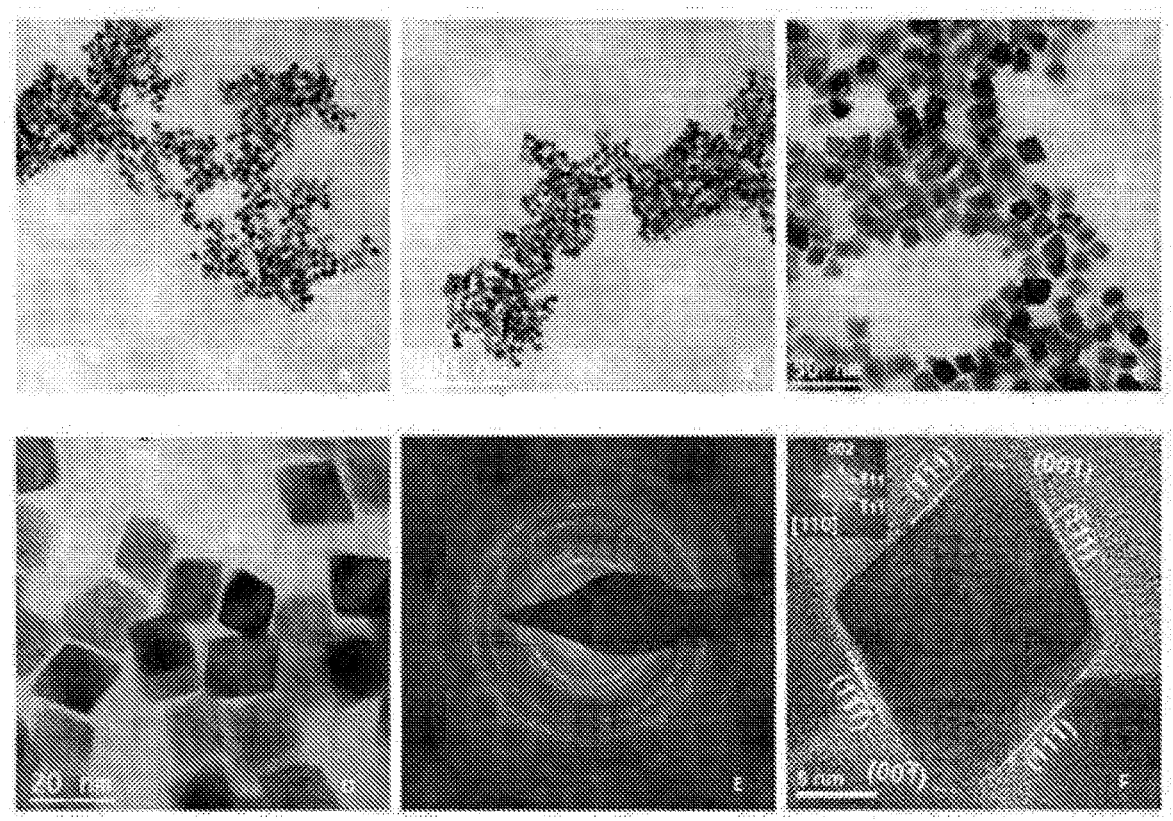
FIG. 6 shows in a), b), c) and d) TEM images, in e) selected area electron diffraction (SAED) images and in f) HR-TEM images of nanoparticles obtained according to an embodiment of the present invention described in example 1
Figure 7:
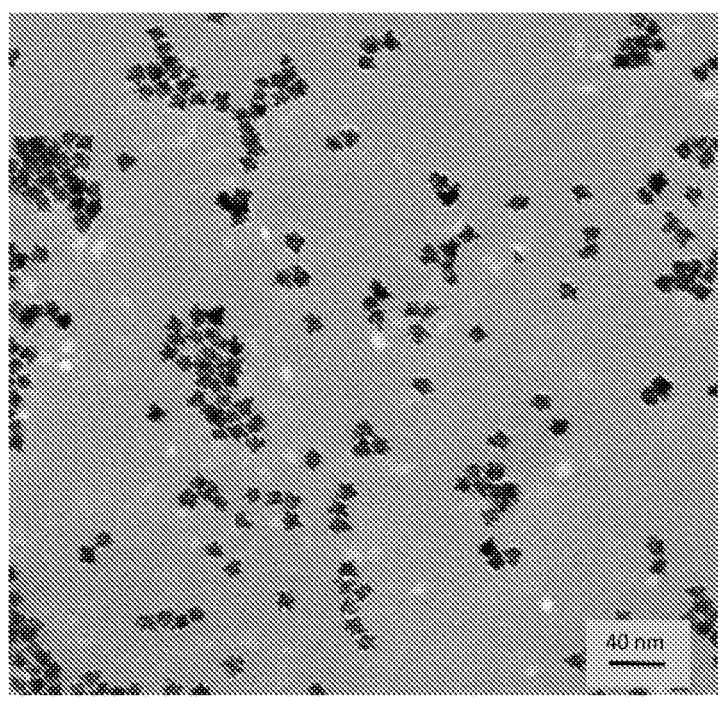
FIG. 7 shows a TEM image of nanoparticles obtained according to an embodiment of the present invention described in example 6.

As described herein, the term "metal seed growth nanoparticle" means a single crystal nanoparticle or a multiple twinned crystal having a certain crystal system from which it is possible to form a larger nanoparticle.

As described herein, the term "shape-directing agent" means a compound that is able to influence the growth of a metal nanoparticle by bonding to one or more of its surfaces, or by altering reduction kinetics so that the growth of the nanoparticles proceeds under either thermodynamic or kinetic control. Examples of "shape directing agents" are polymers, surfactants, ionic salts and organic ligands. Commonly used shape directing agents are, for example, poly (vinylpyrrolidone) and halides.

As described herein, the term "bimetallic nanoparticle" means a nanoparticle composed of two different metal elements.

As described herein, the term "galvanic displacement" means a redox reaction occurring between a metal element and a cation of another metal.

The present invention relates to a method for the synthesis of metal nanoparticles with controlled shape and size. The invention provides a facile method of synthesising metal shaped nanoparticles (cubes, cuboids, octahedrons) without the use of shape directing agents. Therefore, the presence of contaminants on the surface of the nanoparticles, which could affect the catalytic properties of nanoparticles and/or their bio-nano interactions, is avoided.

Furthermore, the method does not employ an organic solvent and is therefore more environmentally friendly than many of the existing methods for nanoparticle synthesis that use organic solvents as a reaction medium. The reaction to form metal nanoparticles having a high percentage of [100] or a high percentage of [111] facets as described herein is thought to proceed under kinetic control.

Preferably the solution does not comprise an organic solvent and/or a shape-directing agent.

The nanoparticles produced according to the method of the invention comprise a high percentage of shaped nanoparticles with [100] facets or [111] facets, preferably having cubic or octahedral shape.

The predominance of [100] facets in the shaped nanoparticles leads to nanoparticles having predominantly a cubic shape, whereas the predominance of [111] facets in the shaped nanoparticles leads to nanoparticles having predominantly an octahedral shape.

The percentage of shaped nanoparticles with [100] facets or with [111] facets that can be obtained with the method of the invention is between 60% and 90% by weight, the remainder to 100% being nanoparticles having different shape, such as irregular shape, preferably having cuboctahedra shape.

In one embodiment, the disclosure refers to a method for producing platinum or palladium nanoparticles having [100] facets, preferably cubic platinum nanoparticles having [100] facets.

In another embodiment the disclosure refers to a method for producing platinum or palladium nanoparticles having [111] facets, preferably octahedral platinum nanoparticles having [111] facets. Preferably, the metal seed growth nanoparticles and the metal salt comprise platinum or palladium. The metal seed growth nanoparticles may be obtained by any method known in the art, preferably according to the method described by Bigall et al. (N. C. Bigall, T. Härtling, M. Klose, P. Simon, L. M. Eng and A. Eychmüller, Nano Letters, 2008, 8, 4588-4592).

The metal seed growth nanoparticles may be present in the solution in a concentration of 2-4 nM of nanoparticles, preferably platinum or palladium nanoparticles.

The concentration of the salt used to grow nanoparticles can determine the sizes of the nanoparticles obtained, thus allowing the size of the platinum or palladium nanoparticles to be controlled by tuning the concentration of Pt or Pd ions in solution during the growth step, as reported.

The metal salt used in the method disclosed herein may be selected from the group comprising $H_2PtCl_6$, $Na_2PtCl_6$, $K_2PtCl_6$, $H_6Cl_2N_2Pt$, $PtCl_2$, $PtBr_2$, $K_2PtCl_6$, $Na_2PtCl_6$, $Li_2PtCl_4$, $H_2Pt(OH)_6$, $Pt(NO_3)_2$, $PtSO_4$, $Pt(HSO_4)_2$, $Pt(ClO_4)_2$, $K_2PtCl_4$, $Na_2PdCl_4$, $Li_2PdCl_4$, $K_2PdCl_6$, $Na_2PdCl_6$, $Li_2PdCl_6$, $PdCl_4$, $PdCl_2$, $(NH_4)_2PdCl_6$, $(NH_4)_2PdCl_4$, $PdCl_4$, $PdCl_2$, $Pd(NO_3)_2$, $PdSO_4$ hydrates thereof, or a mixture of salts and/or hydrates thereof. Preferably the metal salt is a noble metal salt. Even more preferably, the metal salt is $H_2PtCl_6$, $Na_2PtCl_6$, $K_2PtCl_6$, $Na_2PdCl_4$ or $K_2PdCl_6$.

In one embodiment, by using a mixture of salts of different metals, bi-metallic nanoparticles can be obtained. In a further embodiment bi-metallic nanoparticles can also be obtained by galvanic displacement involving the metal seed growth nanoparticle of one metal and a metal salt of another metal.

The metal salt is preferably present in a concentration of between 0.01 and 100 mM, preferably between 0.1 and 5 mM.

The reducing agent employed in the method of the present disclosure may be an organic molecule having less than 8 carboxylic acid and/or carboxylate groups. The reducing agent may also have less than 6 hydroxy groups. The reducing agent preferably has no more than 10 functional groups. The reducing agent preferably does not contain an amino group. The reducing agent preferably does not contain a functional group that strongly binds to the surface of a precious metal. Such disfavoured functional groups include one or more functional groups selected from the group comprising amine groups, thiol groups, phosphine groups and amide groups.

The reducing agent may be a small organic molecule wherein the term "small organic molecule" is defined as a molecule having no more than 10 functional groups, no more than 8 carboxylic acid or carboxylate functional groups, no more than 6 hydroxyl groups and no amino functional groups. The reducing agent may be selected from the group comprising ascorbic acid, sodium citrate, 2-(carboxymethyl)-2-hydroxysuccinate, 3-hydroxybutane-1,2,3-tricarboxylate, 2-carboxy-D-arabinitol, 3,4-dicarboxy-3-hydroxybutanoate, dehydro-D-arabinono-1,4-lactone, 2-(carboxylatomethyl)-5-oxo-2,5-dihydro-2-furoate, 2-(carboxymethyl)-5-oxo-2,5-dihydro-2-furoic acid, 5-ethyl-3-hydroxy-4-methyl-2(5H)-furanone and mixtures thereof.

The reducing agent may be present in the solution in an amount of between 0.1 and 0.7% w/v, preferably between 0.8 and 2.5% w/v, more preferably 1% w/v.

The reducing agent may also act as a stabilising agent.

The solution may be heated to between 95 and 130° C. Preferably to between 105 and 110° C.

The solution may be heated at a rate of between 1° C./min and 5° C./min. Preferably the solution is heated at a rate of between 3° C./min and 5° C./min.

The air in the container in which the solution is contained is maintained at a pressure of between 1 and 5 atm. Preferably the air is maintained at a pressure of between 1 and 2 atm.

In one embodiment of the present disclosure, the concentration of dissolved oxygen in the aqueous solution is less than the concentration of oxygen in an oxygen saturated aqueous solution. The concentration of dissolved oxygen in the solution may be in the range of between 0.01 ppm and 20 ppm, preferably in the range of between 0.1 and 10 ppm.

In another embodiment, the present disclosure concerns a method of producing metal nanoparticles having [100] facets or nanoparticles having [111] facets comprising the steps of:

a) providing a solution comprising water, metal seed growth nanoparticles, a metal salt comprising the same metal as the metal seed growth nanoparticles, and a reducing agent; and b) heating the solution to between 95 and 130° C. at a rate of between 1° C./min and 5° C./min and at a pressure of between 1 and 5 atm. Preferably, the solution does not comprise an organic solvent and/or a shape-directing agent.

In one embodiment, the concentration of dissolved oxygen in the aqueous solution is less than the concentration of oxygen in an oxygen saturated aqueous solution. The concentration of dissolved oxygen in the solution may be in the range of between 0.01 ppm and 20 ppm, preferably in the range of between 0.1 and 10 ppm.

Small organic molecules play an important role in stabilizing the particles in the aqueous solution against aggregation because, thanks to their carboxylic groups and hydroxyl groups, they weakly bind the surface of platinum or palladium nanoparticles. In this way, the molecules avoid major aggregation processes and, at the same time, they can easily be removed with simple washing with water obtaining highly clean surfaces. Even if it has been reported in the literature (WO2014/162308) that sodium citrate and L-ascorbic acid could promote asymmetric growth, the lack of simultaneous control over temperature and pressure, and also on heat transfer and oxygen exposure, leads to spherical nanoparticles composed of several small crystallites with high surface roughness, as reported in Bigall et al. (cited above). This outcome demonstrates that the compounds themselves are not the only player in the asymmetric growth of Pt nanoparticles.

The strict control over said parameters plays a crucial role in the formation of shaped nanoparticles: the same method when is performed with the same temperature and heat transfer rate but without controlling pressure and oxygen exposure in a reflux setup in presence of sodium citrate and L-ascorbic acid does not produce shaped nanoparticles, but spherical nanoparticles, as here shown in the comparative example 3. This outcome highlights the crucial role of the synergy of the reaction parameters in achieving the growth of polyhedrons.

In one embodiment of the invention, the prepared water solution of step a) (preferably introduced in a sealed vessel with a heating system) is subjected to a reduction reaction by tuning preferably the four physical parameters: temperature, heat transfer, pressure, and exposure to oxygen.

The temperature of the reaction is preferably set in the range of 95-130° C., preferably in the range 105-110° C.

The pressure is preferably set between 1-5 atm and preferably between 1-2 atm.

Preferably, the exposure to oxygen and the amount of oxygen in dissolved in water is respectively below 15 ppm, preferably in the range 0.1 ppm and 10 ppm.

The gradient of temperature is preferably slow, in the range from 1°/min to 5°/min, preferably between 3°/min and 5°/min.

Furthermore, the concentration of the salt used to grow nanoparticles can determine the sizes of the nanoparticles obtained, thus allowing to control the size of the platinum nanoparticles by tuning the concentration of Pt ions in solution during the growth step, as reported in Example 2.

The majority of nanoparticles obtained by the here disclosed method, presents a cubic or octahedral shape. It has been demonstrated that cubic and octahedral platinum and palladium nanoparticles present (100) facets or (111) facets. Both types of shaped nanoparticles are interesting for catalysis applications because of their higher catalytic activity. However, some of the nanoparticles obtained with the method of the invention possess cuboctahedra shape with a mixture of (100) and (111) facets.

In view of the polyhedral shapes of the platinum/palladium nanoparticles obtained by the method according to the present disclosure, the platinum/palladium nanoparticles can be used in industrial processes involving selective catalytic reactions.

The platinum/palladium nanoparticle obtained by the method disclosed herein may be used as a catalyst in reactions such as nitrate reduction, electrocatalytic oxygen reduction reaction, dimethyl ether oxidation.

The platinum/palladium nanoparticle obtained by the method disclosed herein may also be used in biological processes involving nano-bio interactions, for example in the field of bio-enzymatic processes.

EXAMPLES

Example 1

Preparation of Pt Shaped Nanoparticles

The synthesis was performed in a sealed container at a pressure slightly above atmospheric pressure. 3 ml of platinum seed growth nanoparticles (synthesized according to the method described by Bigall et al. (N. C. Bigall, T. Härtling, M. Klose, P. Simon, L. M. Eng and A. Eychmüller, Nano Letters, 2008, 8, 4588-4592)) were added to 87 ml of MilliQ water. 108 microliters of chloroplatinic acid hexahydrate 0.5 M was added together with 1.5 ml of 1% citric acid and 1.25% L-ascorbic acid solution. The container was then sealed, immersed in an oil bath and slowly brought to 110° C. The reaction was kept under these conditions for 1 hour whilst being stirred at a moderate rate. The container was then removed from the oil bath and left to cool under stirring for another hour. The nanoparticles obtained had a dimension of 18.5 nm.

Example 2

Preparation of Pt Shaped Nanoparticles Tuning the Dimension Control

In order to investigate the effect of the Pt precursor concentration on the size of nanoparticles, a synthesis as described in example 1 was performed, but 54 microliters (instead of 108 microliters) of chloroplatinic acid hexahydrate 0.5 M was added. The nanoparticles obtained had a dimension of 10 nm, less than the dimension obtained using 108 microliters of chloroplatinic acid hexahydrate (18.5 nm).

Example 3

Comparative Example with Literature (Bigall et al.)

The synthesis was performed using reflux apparatus as reported in the literature. 3 ml of platinum seed growth nanoparticles (synthesized according to the method described by Bigall et al. were added to 87 ml of MilliQ water. 108 microliter of chloroplatinic acid hexahydrate 0.5 M was added together with 1.5 ml of 1% citric acid and 1.25% L-ascorbic acid solution. The container (having reflux apparatus attached thereto) was immersed in an oil bath and slowly brought to 110° C. The reaction was kept under these conditions for 1 hour whilst being stirred at a moderate rate. The container was then removed from the oil bath and left to cool whilst being stirred for another hour.

Example 4

Growth of Gold Nanoparticles Using the Same Protocol Described Above

The synthesis was performed in a sealed container at a pressure slightly above atmospheric pressure. 3 ml of gold seed growth nanoparticles (synthesized according to the method described by Maiorano et al. (G. Maiorano, S. Sabella, B. Sorce, V. Bruentti, M. A. Malvindi, R. Cingolani, P. Pompa. ACS Nano, 2010, 4, 7481-7491)), having the same concentration as the seed growth nanoparticles of example 1, were added to 87 ml of MilliQ water. 108 microliters of chloroauric acid 0.5 M were added together with 1.5 ml of 1% citric acid and 1.25% L-ascorbic acid solution. The container was then sealed, immersed in an oil bath and slowly brought to 110° C. The reaction was kept under these conditions for 1 hour whilst being stirred at a moderate rate. The container was then removed from the oil bath and left to cool whilst being stirred for another hour.

Example 5

Growth of Palladium Nanoparticles with Octahedral and Polyhedral Shape

The synthesis was performed in a sealed container at a pressure slightly above atmospheric pressure. 3 ml of palladium seed growth nanoparticles (synthesized according to the method described by Bigall et al. (N. C. Bigall, T. Härtling, M. Klose, P. Simon, L. M. Eng and A. Eychmüller, Nano Letters, 2008, 8, 4588-4592)) having the same concentration as the seed growth nanoparticles of example 1 and 4, were added to 87 ml of MilliQ water. 108 microliters of sodium tetrachloropalladate 0.5 M were added together with 1.5 ml of 1% citric acid and 1.25% L-ascorbic acid solution. The container was then sealed, immersed in an oil bath and slowly brought to 110° C. The reaction was kept under these conditions for 1 hour whilst being stirred at a moderate rate. The container was then removed from the oil bath and left to cool whilst being stirred for another hour.

Example 6

Synthesis of Multipods and, More Specifically, Octapods

Multipods nanoparticles are synthesized in a sealed container at a pressure slightly above atmospheric pressure. 3 ml of platinum seed growth nanoparticles (synthesized according to the method described by Bigall et al. (N. C. Bigall, T. Härtling, M. Klose, P. Simon, L. M. Eng and A. Eychmüller, Nano Letters, 2008, 8, 4588-4592)) having the same concentration as the seed growth nanoparticles of example 1, were added to 87 ml of MilliQ water. 14 microliter of chloroplatinic acid hexahydrate 0.5 M and 14 microliter of potassium tetrachloroplatinate 0.5 M were added together with 1.5 ml of 1% citric acid and 1.25% L-ascorbic acid solution. The container was then sealed, immersed in an oil bath and slowly brought to 200° C. The reaction was kept under these conditions for 1 hour whilst being stirred at a moderate rate. The container was then removed from the oil bath and left to cool whilst being stirred for another hour.

Examples 1, 4 and 5 show different embodiments of the present invention wherein different metal nanoparticles, respectively platinum, gold and palladium are obtained.

Example 2 demonstrates that it is possible to control the size of the nanoparticles obtained by changing the concentration of the platinum or palladium ions in the solution.

Example 3 is a comparative example and illustrates that if the pressure of the air in the container and exposure to oxygen are not controlled; spherical nanoparticles composed of several small crystallites with high surface roughness are obtained.

Example 6 shows an embodiment of the present invention wherein a mixture of metal salt precursors are employed. In this case, the formation of pods on the surface of the obtained nanoparticles can be observed.

The here described method is amenable to scale-up, for examples using microwave reactors.

The invention claimed is:

1. A method for producing metal nanoparticles having [100] or [111] facets comprising the steps of:
   a) providing a solution comprising water, metal seed growth nanoparticles, a metal salt comprising the same metal as the metal seed growth nanoparticles, and a reducing agent;
   b) heating the solution to between 95 and 130° C. at a rate of between 1° C./min and 5° C./min, under a pressure of between 1 and 5 atm, while maintaining the solution under a reduced oxygen atmosphere and wherein the concentration of dissolved oxygen in the solution is less than the concentration of oxygen in an oxygen saturated solution,
   providing that the solution does not comprise an organic solvent or a shape-directing agent.

2. A method for producing metal nanoparticles according to claim 1, in which said metal nanoparticles have [100] facets.

3. A method for producing metal nanoparticles according to claim 1, in which said metal nanoparticles have [111] facets.

4. The method according to claim 1, wherein the concentration of dissolved oxygen in solution is in the range of between 0.01 ppm and 20 ppm.

5. The method according to claim 4, wherein the concentration of dissolved oxygen in solution is in the range of between 0.1 and 10 ppm.

6. The method according to claim 1, wherein the metal seed growth nanoparticles and the metal salt comprise platinum or palladium.

7. The method according to claim 1, wherein the metal salt is selected from the group consisting of $H_2PtCl_6$, $Na_2PtCl_6$, $K_2PtCl_6$, $H_6Cl_2N_2Pt$, $PtCl_2$, $PtBr_2$, $K_2PtCl_6$, $Na_2PtCl_6$, $Li_2PtCl_4$, $H_2Pt(OH)_6$, $Pt(NO_3)_2$, $PtSO_4$, $Pt(HSO_4)_2$, $Pt(ClO_4)_2$, $K_2PtCl_4$, $Na_2PdCl_4$, $Li_2PdCl_4$, $K_2PdCl_6$, $Na_2PdCl_6$, $Li_2PdCl_6$, $PdCl_4$, $PdCl_2$, $(NH_4)_2PdCl_6$, $(NH_4)_2PdCl_4$, $PdCl_4$, $PdCl_2$, $Pd(NO_3)_2$, $PdSO_4$ hydrates thereof, and a mixture of salts and or hydrates thereof.

8. The method according to claim 7, wherein the metal salt is $H_2PtCl_6$, $Na_2PtCl_6$, $K_2PtCl_6$, $Na_2PdCl_4$ or $K_2PdCl_6$.

9. The method according to claim 1, wherein the metal salt is present in a concentration of between 0.01 and 100 mM.

10. The method according to claim 9, wherein the metal salt is present in a concentration of between 0.1 and 5 mM.

11. The method according to claim 1, wherein the reducing agent is an organic molecule having less than 8 carboxylic acid and/or carboxylate groups, and less than 6 hydroxy groups.

12. The method according to claim 1, wherein the reducing agent is selected from the group consisting of ascorbic acid, sodium citrate, 2-(carboxymethyl)-2-hydroxysuccinate, 3-hydroxybutane-1,2,3-tricarboxylate, 2-carboxy-D-arabinitol, 3,4-dicarboxy-3-hydroxybutanoate, dehydro-D-arabinono-1,4-lactone, 2-(carboxylatomethyl)-5-oxo-2,5-dihydro-2-furoate, 2-(carboxymethyl)-5-oxo-2,5-dihydro-2-furoic acid, 5-ethyl-3-hydroxy-4-methyl-2(5H)-furanone, and mixtures thereof.

13. The method according to claim 1, wherein the reducing agent is present in the solution in an amount of between 0.1 and 0.7% w/v.

14. The method according to claim 13, wherein the reducing agent is present in the solution in an amount of between 0.8 and 2.5% w/v.

15. The method according to claim 1, wherein the solution in step b) is heated to between 105 and 110° C.

16. The method according to claim 1, wherein the pressure of the solution is between 1 and 2 atm.

17. The method according to claim 1, wherein the solution is heated at a rate of between 3° C./min to 5° C./min.

* * * * *